United States Patent [19]

Momose

[11] Patent Number: 5,031,020

[45] Date of Patent: Jul. 9, 1991

[54] SEMICONDUCTOR DEVICE HAVING TWO DIFFERENT ACTIVE ELEMENTS WHOSE PARTIAL AREA IS COMMONLY USED

[75] Inventor: Hiroshi Momose, Tokyo, Japan

[73] Assignee: Kabushiki Kaisha Toshiba, Kawasaki, Japan

[21] Appl. No.: 407,299

[22] Filed: Sep. 14, 1989

[30] Foreign Application Priority Data

Oct. 11, 1988 [JP] Japan .................. 63-255213

[51] Int. Cl.⁵ ............................. H01L 27/02
[52] U.S. Cl. ...................... 357/43; 357/46; 357/34; 357/23.4
[58] Field of Search ............ 357/43, 46, 34, 42, 357/35, 23.4

[56] References Cited

U.S. PATENT DOCUMENTS

| | | | |
|---|---|---|---|
| 4,825,274 | 4/1989 | Higuchi et al. | 357/43 |
| 4,868,135 | 9/1989 | Ogura et al. | 357/43 X |
| 4,907,059 | 3/1990 | Kobayashi et al. | 357/43 |

FOREIGN PATENT DOCUMENTS 52-26181 2/1977 Japan .
59-161059 9/1984 Japan .

OTHER PUBLICATIONS

Ogura et al, "Design and Characteristics of the Lightly Doped Drain-Source (LDD) Insulated Gate Field-Effect Transistor", IEEE Journal of Solid-State Circuits, vol. SC-14, No. 4, Aug. 1980, pp. 424-432.

Parrillo et al., "Disposable Polysilicon LDD Spacer Technology", IEEE Transactions on Electron Devices, vol. 38, No. 1, Jan. 1991, pp. 39-46.

Japanese Patent Disclosure (Kokai) 52-26181, filed Aug. 22, 1975.

Japanese Patent Disclosure (Koki) 59-161059, filed Mar. 3, 1983.

Primary Examiner—William Mintel
Attorney, Agent, or Firm—Finnegan, Henderson, Farabow, Garrett, and Dunner

[57] ABSTRACT

A semiconductor device according to the present invention comprises a P-channel MOSFET having a gate, a source, and a drain, and a bipolar transistor having a collector, a base, and an emitter. The semiconductor device also includes an $N^-$-type collector diffusion layer formed in an epitaxial layer on a P-type semiconductor substrate and adjacent to an $N^+$-type buried collector diffusion layer, and an $N^+$-type electrode lead-out region formed in contact with the $N^+$-type buried collector diffusion layer having an impurity concentration higher than the $N^-$-type collector layer. A gate electrode section constituted by a gate oxide film and a gate electrode is formed on the $N^-$-type collector layer and the $N^+$-type electrode lead-out region, and an P-type impurity is ion-implanted into the source region of the P-channel MOSFET and and an N-type impurity is doped into the emitter region of the bipolar transistor, with the gate electrode section being used as a mask. Furthermore, a P-type impurity is ion-implanted into a common area of the drain region of the P-channel MOSFET and the base region of the bipolar transistor and is diffused into the common area to a preset depth. Thus, the semiconductor device of bipolar-CMOS structure having a drain and base as the common area can be obtained.

6 Claims, 4 Drawing Sheets

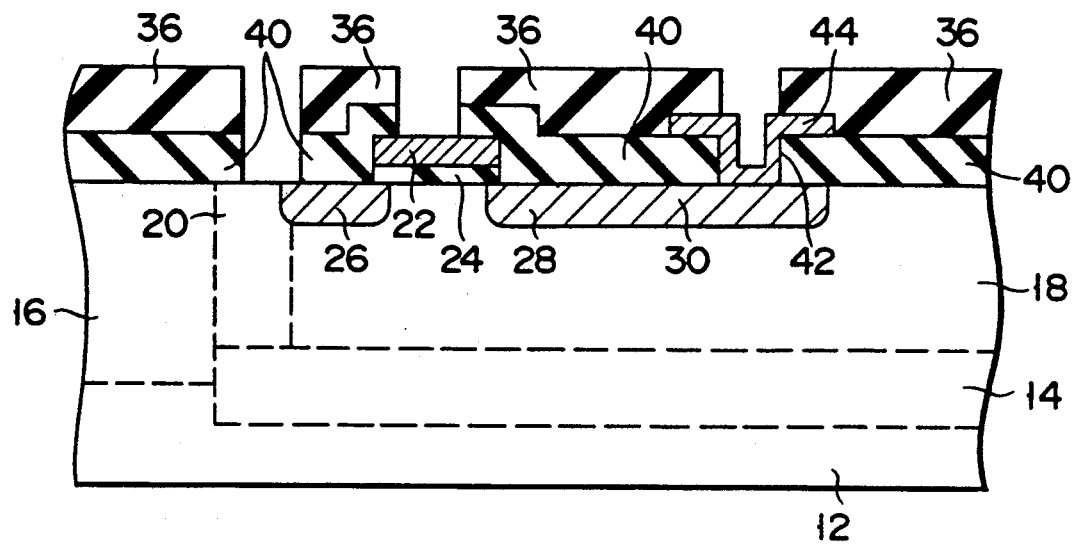
F I G. 3D
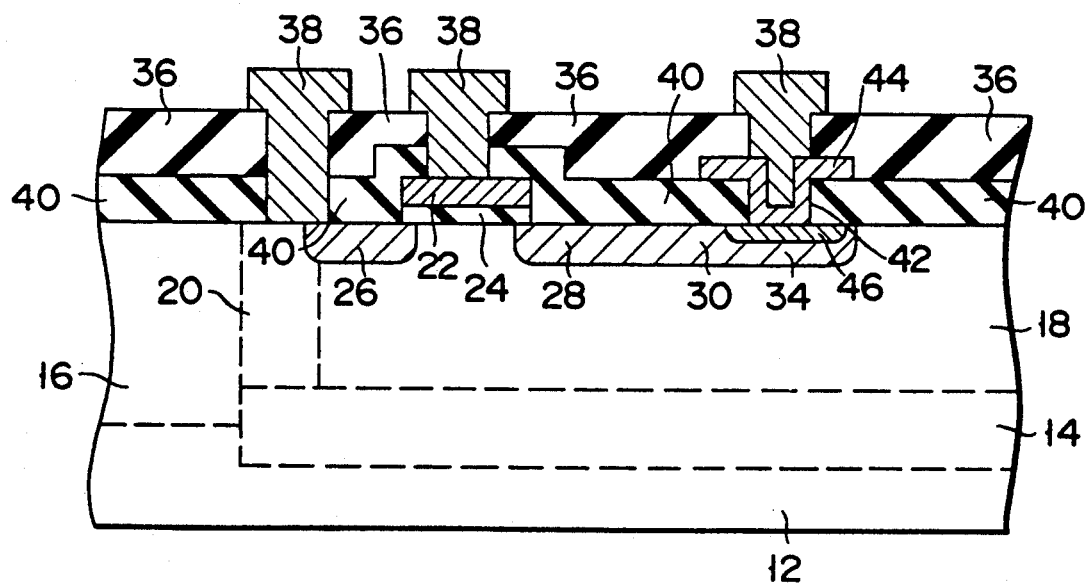
F I G. 3E

SEMICONDUCTOR DEVICE HAVING TWO DIFFERENT ACTIVE ELEMENTS WHOSE PARTIAL AREA IS COMMONLY USED

BACKGROUND OF THE INVENTION

1. Field of the Invention

This invention relates to a semiconductor device and a method for manufacturing the same, and more particularly, to a semiconductor device having two different active elements of bipolar-CMOS structure whose drain and base are used as a common area, and to a method for manufacturing the same.

2. Description of the Related Art

Using conventional semiconductor technology, various types of semiconductor devices of bipolar-CMOS (which is hereinafter referred to as Bi-CMOS) structure—which structure permits a bipolar circuit and a CMOS circuit to be formed on the same chip—have been developed. An example of a semiconductor device of Bi-CMOS structure is disclosed in U.S. Pat. No. 4,616,146. FIG. 1 shows a typical example of the prior art circuit construction of a semiconductor device of this structure.

Referring to FIG. 1, drain D of P-channel MOSFET Q1 is connected to the base of NPN bipolar transistor Q2. The drain current of MOSFET Q1 is amplified by NPN bipolar transistor Q2, with the result that, the circuit constructed thus is able to supply a large current. Transistors Q1' and Q2' are of the same type as transistors Q1 and Q2.

A cross sectional view of an element of a transistor forming area, which is a part of a Bi-CMOS composite circuit, is shown in the article "2 MICRON MERGED BIPOLAR-CMOS TECHNOLOGY" by A. R. Alvarez, P. Meller and B Tien of Motorola Inc., Mesa in IEDM 84 pp. 761-764.

Hitherto, in a semiconductor device of the type shown in FIG. 1, for example, an $N^+$-type buried collector diffusion layer, P-type epitaxial layer, $N^-$-type collector diffusion layer and $N^+$-type electrode lead-out area are formed on a P-type semiconductor substrate by use of the well known ion-implantation technique, epitaxial growth, thermal diffusion technique and the like. P-channel MOSFET Q1 and NPN bipolar transistor Q2 are respectively formed in different areas of the $N^-$-type collector layer. Drain D of P-channel MOSFET Q1 and base B of bipolar transistor Q2 are connected to each other by means of a wiring member such as an aluminum layer formed outside the element area. In this way, a semiconductor device having multi-functions can be obtained by simultaneously effecting the processes of manufacturing MOSFET Q1 and bipolar transistor Q2.

However, in the semiconductor device with the above-described structure, wiring regions for making electrical connection with the two different active elements are formed in different positions and therefore the chip area cannot be reduced.

SUMMARY OF THE INVENTION

Accordingly, an object of this invention is to provide a semiconductor device in which the chip area can be reduced by reducing the area of the wiring region for making electrical connection with two different active elements and part of the two different active elements is commonly used and a method for manufacturing the same.

According to an aspect of the present invention, there is provided a semiconductor device including two different active elements whose partial area is commonly used, comprising a semiconductor substrate of a first conductivity type; a first diffusion layer of a second conductivity type opposite to the first conductivity type formed on the semiconductor substrate; a second diffusion layer of the second conductivity type for electrode lead-out having an impurity concentration higher than the first diffusion layer and formed in contact with the first diffusion layer; a first impurity region of the first conductivity type of a first-conductivity type active element which is one of the two different active elements, the first impurity region being formed on the first and second diffusion layers; an electrode section for the first-conductivity type active element formed on the first diffusion layer; a second impurity region of the first conductivity-type active element continuously formed on the first diffusion layer, the second impurity region being also used as a first impurity region of the other of the two different active elements; and a third impurity region of the other active element formed on part of the second impurity region.

According to another aspect of the present invention, there is provided a method for manufacturing a semiconductor device having two different active elements whose partial area is commonly used, comprising the steps of forming a first diffusion layer in an epitaxial layer formed on a semiconductor substrate of a first conductivity type and in contact with a buried diffusion layer of a second conductivity type opposite to the first conductivity type; forming a second diffusion layer of the second conductivity type for electrode lead-out in contact with the buried layer having an impurity concentration higher than the first diffusion layer; forming an electrode section for a first-conductivity type active element which is one of the two different active elements on the first and second diffusion layers; ion-implanting impurity of the first conductivity type into a first impurity region of the first-conductivity type active element with the electrode section used as a mask; ion-implanting impurity of the second conductivity type into a third impurity region of the other of the two different active elements; ion-implanting impurity of the first conductivity type into a second impurity region which is used as a common region of the first-conductivity type active element and the other active element diffusing impurities to a preset depth.

According to still another aspect of the present invention, there is provided a method for manufacturing a semiconductor device having two different active elements whose partial area is commonly used, comprising the steps of forming a first diffusion layer in an epitaxial layer formed on a semiconductor substrate of a first conductivity type and in contact with a buried diffusion layer of a second conductivity type opposite to the first conductivity type; forming a second diffusion layer of the second conductivity type for electrode lead-out in contact with the buried layer having an impurity concentration higher than the first diffusion layer; forming an electrode section for a first-conductivity type active element which is one of the two different active elements on the first and second diffusion layers; ion-implanting impurity of the first conductivity type into a first impurity region acting as the source of the first-conductivity type MOSFET with the electrode section used as a mask; ion-implanting impurity of the first conductivity type into a second impurity region which is used as a common region of the first-conductivity type active element and the other active element; depositing a preset insulation film on the first and second diffusion layers; effecting an etching process in a predetermined area of the second impurity region after depositing the preset insulation film to form hole means in contact with the second impurity region; and solid-phase diffusing impurity of the second conductivity type into a third impurity region to form the third impurity region in the second impurity region via the hole means.

BRIEF DESCRIPTION OF THE DRAWINGS

The aforementioned aspects and other features of the present invention are explained in the following description, taken in conjunction with the accompanying drawings wherein:

FIGS. 3A through 3E are cross sectional views of part of a semiconductor device according to another embodiment of this invention shown in a sequence of the manufacturing steps.

DETAILED DESCRIPTION OF THE PREFERRED EMBODIMENTS

There will now be described an embodiment of this invention with reference to the accompanying drawings.

FIGS. 2A through 2D are cross sectional views of part of a semiconductor device according to one embodiment of this invention shown in a sequence of the manufacturing steps. The manufacturing process for a semiconductor device of Bi-CMOS structure having P-channel MOSFET Q1 and NPN bipolar transistor Q2 shown in FIG. 2 is as follows.

Figure 1:
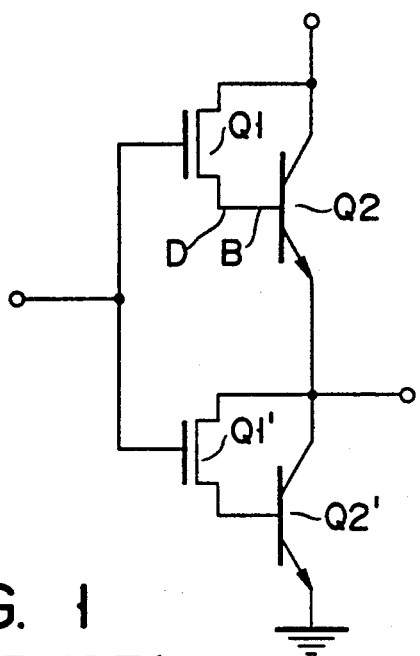
FIG. 1 is a circuit diagram showing a typical example of the prior art composite Bi-CMOS circuit.
Figure 2A:
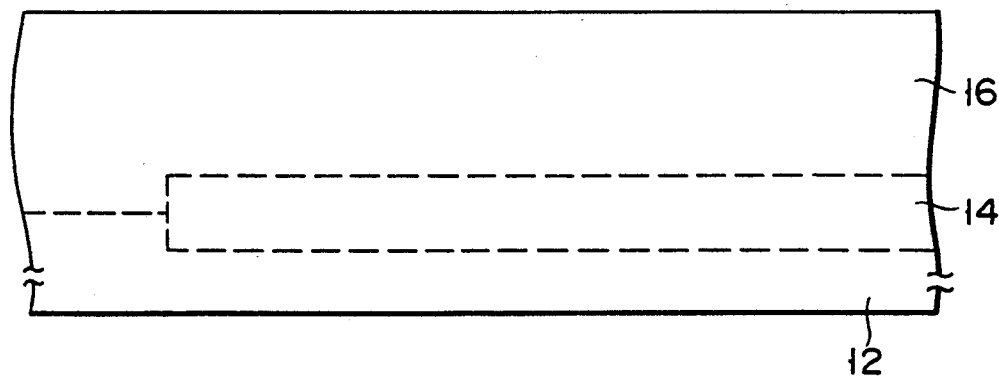
FIGS. 2A through 2D are cross sectional views of part of a semiconductor device according to one embodiment of this invention shown in a sequence of the manufacturing steps.

First, as shown in FIG. 2A, a thermal oxide film (not shown) is formed on P-type semiconductor substrate 12 to form a buried diffusion layer pattern by using a photoresist (not shown). Then a portion of the thermal oxide film in a buried diffusion layer forming area is removed with the photoresist used as a mask. Arsenic (As), which is an N-type impurity, is ion-implanted and diffused into an area in which the thermal oxide film has been removed to form N+-type buried collector diffusion layer 14. Next, P-type epitaxial layer 16 is vapor-deposited on the entire surface of the structure by the well-known epitaxial growth.

Figure 2B:
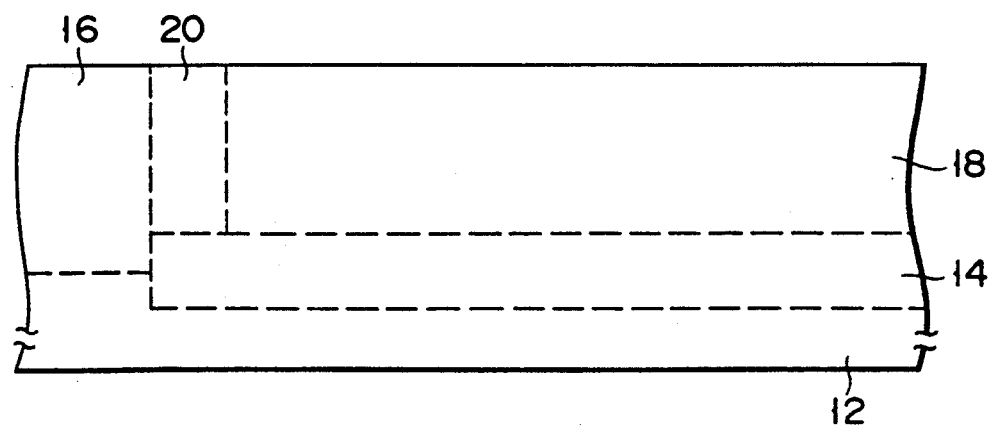

After this, as shown in FIG. 2B, a collector diffusion layer pattern is formed by using a photoresist (not shown). Then, phosphorus (P), which is an N-type impurity, is ion-implanted and thermally diffused into epitaxial layer 16 to reach N+-type buried collector diffusion layer 14 with the photoresist used as a mask, thus forming N−-type- collector diffusion layer 18. Next, in order to form an electrode lead-out high impurity concentration diffusion region, a high impurity concentration diffusion region photoresist pattern is formed in N+-type buried collector diffusion layer 14 by using a photoresist (not shown). Then, phosphorus (P), which is an N-type impurity, is ion-implanted and thermally diffused to reach N+-type buried collector diffusion layer 14 with the photoresist used as a mask, thus forming N+-type electrode lead-out region 20.

Figure 2C:
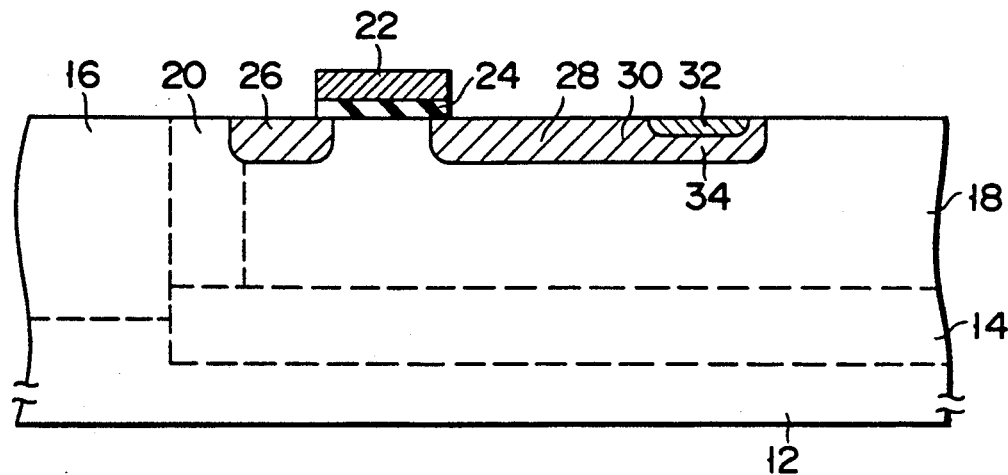

Next, as shown in FIG. 2C, a gate electrode portion of polysilicon gate electrode 22 and gate oxide film 24 is formed by forming a gate oxide film by thermal diffusion, depositing polysilicon on the entire surface of the structure and patterning the gate oxide film and polysilicon film. Then, boron (B), which is a P-type impurity, is ion-implanted into source forming region 26 of the MOSFET at a high impurity concentration with the gate electrode section used as a mask. Next, boron (B) of P-type is ion-implanted into drain region 28 of the MOSFET and base region 30 of the bipolar transistor. Further, P+-type diffusion layer serving as the source of the MOSFET, P-type diffusion regions 28, 30 and 34 commonly serving as the drain of the MOSFET and the base of the bipolar transistor and N+-type diffusion region 32 serving as the emitter of the bipolar transistor are formed to respective preset depths by ion-implanting arsenic (As), which is an N-type impurity, into emitter region 32 of the bipolar transistor at a high impurity concentration and thermally diffusing the ion-implanted impurity. In this case, for example, source P+-type diffusion region 26 of the MOSFET and drain and base P-type diffusion regions 28, 30 and 34 are formed to the depth of 0.2 to 0.3 $\mu$m from the surface of collector diffusion layer 18 and emitter N+-type diffusion region 32 is formed to the depth of 0.1 $\mu$m.

The N- and P-type impurities, such as boron (B) and arsenic (As), have different diffusion speeds, and arsenic (As), which is an N-type impurity, has a lower thermal diffusion speed than boron (B), which is a P-type impurity. Therefore, drain and base P-type regions 28, 30 and 34 are formed deeper than N+-type emitter diffusion region 32 and creep under N+-type emitter diffusion region 32 so that N+-type emitter diffusion region 32 can be formed as if it floats in drain and base P-type regions 28, 30 and 34.

Figure 2D:
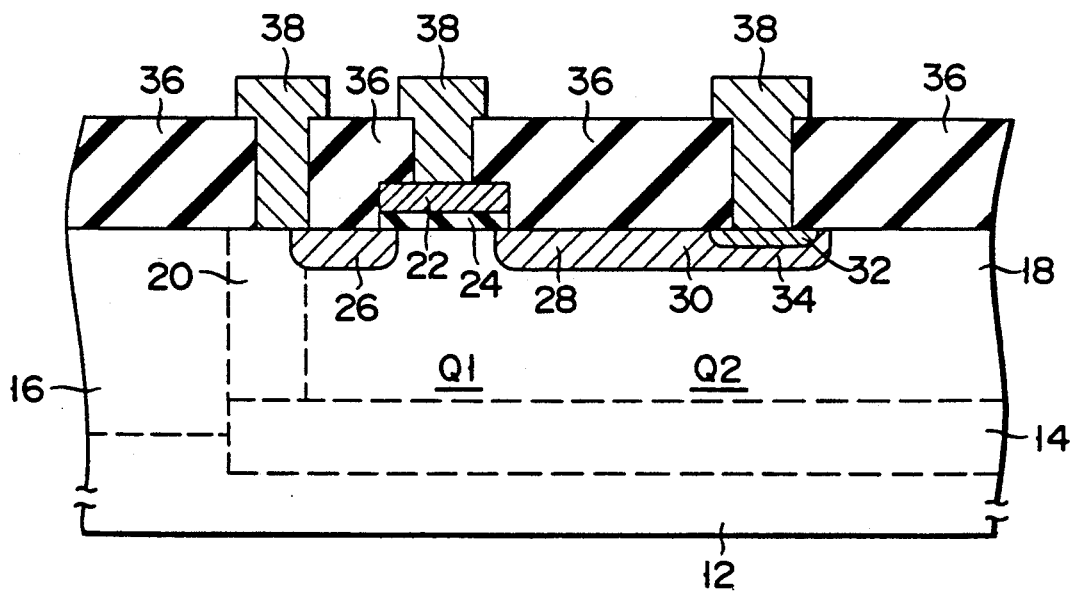

After source P+-type diffusion region 26, drain and base P-type diffusion regions 28, 30 and 34 and N+-type diffusion region 32 are formed as described above, a silicon oxide film is formed as interlayer insulation film 36 by the well-known CVD method as shown in FIG. 2D. Then, a contact hole forming pattern is formed by use of a photoresist (not shown). Contact holes are formed by using the photoresist as a mask, and then aluminum alloy is deposited to form preset wiring member 38 for the wiring so as to attain a semiconductor device according to the above embodiment.

With the above construction, drain 28 of P-channel MOSFET Q1 and bases 30 and 34 of NPN bipolar transistor Q2 are formed of the same diffusion region and formation of the diffusion region permits the wiring for electrical connection between the MOSFET and the bipolar transistor to be removed. As a result, the integration density in a lateral direction of the semiconductor device can be enhanced by 20 to 30% for each element, for example.

Furthermore, drain 28 of P-channel MOSFET Q1 and bases 30 and 34 of NPN bipolar transistor Q2 are formed in the same manufacturing process and in the same manufacturing condition. As a result, it is not necessary to pay much attention to the alignment tolerance even when forming different regions, and therefore a more miniaturized structure can be obtained.

The manufacturing condition of internal base 34 is automatically determined by the impurity concentration of external base 30 of the bipolar transistor. Therefore, in order to permit drain 28 and bases 30 and 34 to be formed in the same manufacturing process, a condition that the surface impurity concentration is $1 \times 10^{17}$ to $5 \times 10^{19}$ cm$^{-3}$ and the diffusion depth is 0.1 to 0.3 μm must be satisfied.

The impurity concentration of the drain of a P-channel MOSFET, particularly of a P-channel MOSFET less than 1.0 μm, is set to be lower near the drain so as to make an electric field at the junction weak, thereby preventing degradation in the characteristic of the P-channel MOSFET due to the presence of hot electrons. Further, the impurity concentration of the drain is set to be lower than the impurity concentration of the prior art case ($>1 \times 10^{20}$ cm$^{-3}$) and is preferably set to be lower than $1 \times 10^{17}$ cm$^{-3}$ to $5 \times 10^{19}$ cm$^{-3}$ because, in this condition, the short channel effect inherent to a MOSFET can be sufficiently suppressed.

In the former embodiment, the P-channel MOSFET is formed in combination with the NPN bipolar transistor on the P-type semiconductor substrate. However, it is possible to form an N-channel MOSFET in a P-type well region formed in an N-type semiconductor substrate in combination with a PNP bipolar transistor. In this case, it is preferable to use phosphorus (P) or arsenic (As) as the N-type impurity and boron (B) as the P-type impurity and control the impurity concentration of the N$^-$-type region (the drain of the N-channel MOS and the base of the PNP bipolar transistor) so as to suppress degradation in the characteristic of the device due to the presence of hot electrons and at the same time to satisfy the manufacturing condition of internal base 34.

In addition to the method in the above embodiment, it is possible to form the emitter region by doping impurity into the silicon substrate from polysilicon. This is true of the PNP bipolar transistor and N-channel MOS formed in the P-type semiconductor substrate and formed in the N-type region of the P-type semiconductor substrate.

Figure 3A:
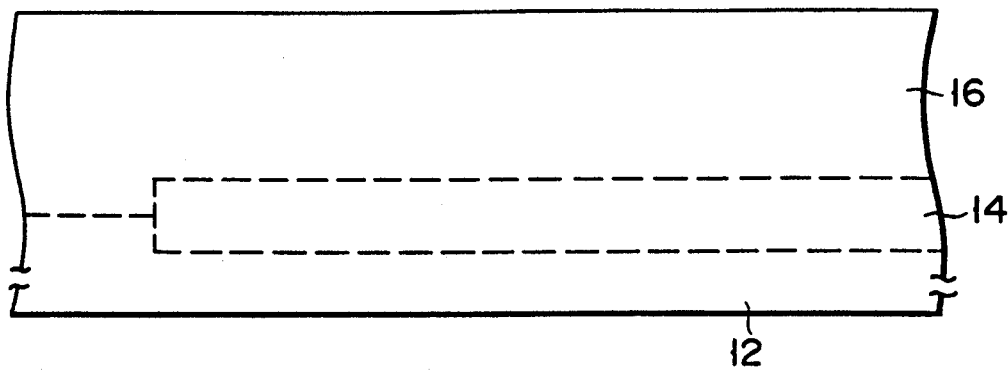
Figure 3B:
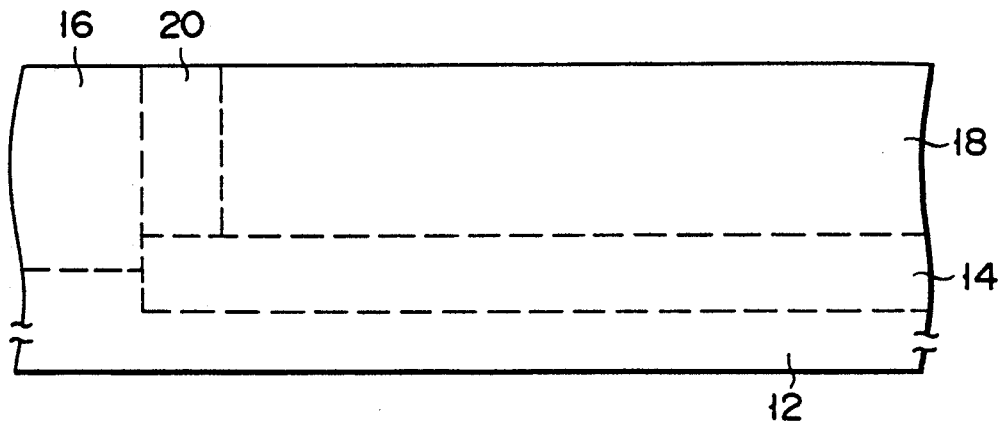
Figure 3C:
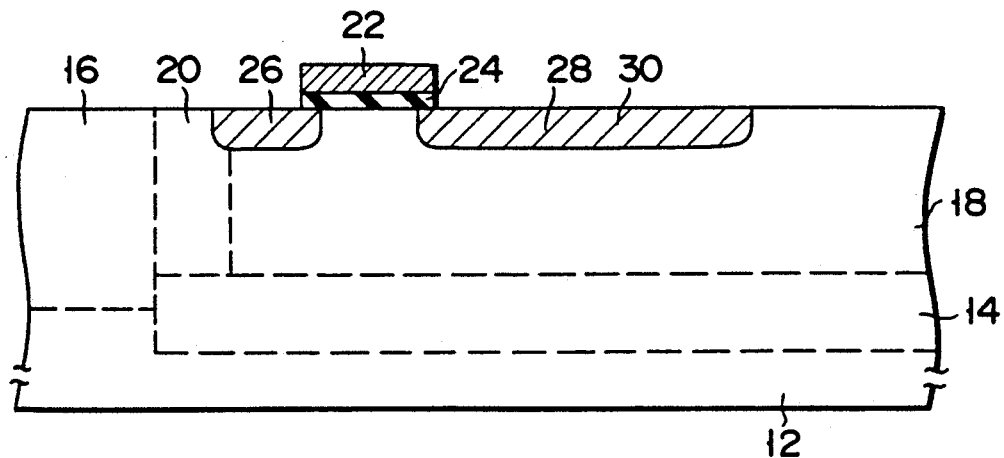

That is, in the second embodiment, N$^+$-type buried collector diffusion layer 14, P-type epitaxial layer 16, N$^-$-type collector diffusion layer 18 and N$^+$-type electrode lead-out region 20 are formed on P-type semiconductor substrate 12 according to the manufacturing process shown in FIGS. 3A and 3B. The explanation for the embodiment shown in FIGS. 3A and 3B is the same as that for the above embodiment shown in FIGS. 2A and 2B and therefore it is omitted here. After layers 14, 16, 18 and 20 are formed on P-type semiconductor substrate 12, the source, drain and external base of a P-channel MOSFET are formed. That is, in the same manufacturing step as shown in FIG. 2C, a gate electrode section of polysilicon gate electrode 22 and gate oxide film 24 is formed as shown in FIG. 3C. Then, boron (B) which is a P-type impurity is ion-implanted into source forming area 26 at a high impurity concentration and boron (B) which is a P-type impurity is ion-implanted into drain and base regions 28 and 30.

After source 26, drain 28 of the P-channel MOSFET and external base 30 of the NPN transistor are formed, a step of depositing CVD interlayer insulation film 40 shown in FIG. 3D is effected instead of the ion-implantation step for forming emitter region 32 shown in FIG. 2C. After the deposition of CVD interlayer insulation film 40, CVD film 40 in the emitter forming area is etched out by using a photoresist process to form emitter hole 42. After this, polysilicon is deposited on the entire surface and then processed as shown in FIG. 3D, thus forming emitter electrode 44 formed of polysilicon.

Next, as shown in FIG. 3E, for example, arsenic (As) is ion-implanted as an N-type impurity into the area and the heat treatment process is effected. As a result, emitter 46 is formed in the base region by the solid-phase diffusion of arsenic (As) from polysilicon 44 into the silicon substrate. As the result of formation of emitter 46, internal base 34 is formed. Then, emitter hole 42 is formed with a photoresist (not shown) used as a mask, and aluminum alloy is deposited on the structure to form preset wiring member 38 for the wiring, thus manufacturing a semiconductor device of this embodiment.

With the above manufacturing process, shallower emitter region 46 can be formed by the solid-phase diffusion, making it possible to form a bipolar transistor with higher performance.

In the former embodiment, the P-type epitaxial layer is used, but it is possible to form an N-type epitaxial layer. In this case, boron (B) is ion-implanted as a P-type impurity into an area (area 16 of FIGS. 2A through 2D) other than the bipolar transistor area and P-channel MOSFET area to form P-type impurity region 16 in contact with the P-type substrate.

Further, in the above embodiment, the NPN bipolar transistor and P-channel MOSFET are formed in P-type silicon substrate 12, but it is possible to form the NPN bipolar transistor and P-channel MOSFET in the N-type silicon substrate (area 12 of FIGS. 2A through 2D). In this case, collector 14 of the NPN bipolar transistor is set at the same potential as N-type substrate 12. Further, the same effect can be attained when a PNP bipolar transistor and an N-channel MOSFET are formed in a P-type silicon substrate whose conductivity type is completely inverted. In the above embodiment, the impurity is ion-implanted into both the source and drain regions of the base. However, the impurity may be ion-implanted into only the source region.

As described above, in a semiconductor device such as a Bi-CMOS circuit, the drain region of the MOSFET and the base region of the bipolar transistor are simultaneously connected directly to a single common diffusion region. With this construction, since the drain region of the MOSFET and the base region of the bipolar transistor are electrically connected to each other by means of the single diffusion region, it is not necessary to form an external wiring member. Therefore, it becomes possible to reduce the chip area of the semiconductor device. Furthermore, since the drain region and the base region can be formed in a uniform and continuous configuration and formed in the same manufacturing step, it is not necessary to pay much attention to the mask alignment tolerance which is generally required for forming different regions and therefore the construction can be further miniaturized.

What is claimed is:

1. A semiconductor device including two different active elements having a common partial area, said device comprising:
   a semiconductor substrate of a first conductivity type;
   a first diffusion layer of a second conductivity type opposite to the first conductivity type, formed on said semiconductor substrate;
   a second diffusion layer of the second conductivity type located adjacent to said first diffusion layer, for leading out electrodes, said second diffusion layer having an impurity concentration higher than that of said first diffusion layer;

a first impurity region of the first conductivity type formed in upper surfaces of said first and second diffusion layers and constituting part of a first active element of the first conductivity type;

an electrode section of the first conductivity type formed in an upper surface of said first diffusion layer, said electrode section functioning as an electrode of said first active element;

a second impurity region of the first conductivity type formed in the upper surface of said first diffusion layer constituting part of said first active element;

a third impurity region of the first conductivity type formed in the upper surface of said first diffusion layer and constituting part of a second active element, said third impurity region and said second impurity region being continuous to each other and forming a common partial area; and a fourth impurity region of the second conductivity type formed in portions of the upper surfaces of said second and third impurity regions and constituting part of said second active element;

wherein said second and third impurity regions have a surface impurity concentration of $1 \times 10^{17}$ to $5 \times 10^{19}$ cm$^{-3}$.

2. A semiconductor device according to claim 1, wherein said first active element is a MOSFET of the first conductivity type and said second active element is a bipolar transistor.

3. A device according to claim 2, wherein said common partial area serves as the drain region of said MOSFET and also as the base region of said bipolar transistor.

4. A device according to claim 3, wherein that portion of said common partial areas which serves as the drain region of said MOSFET has the same impurity concentration as that portion of said common partial area which serves as the base region of said bipolar transistor.

5. A device according to claim 1, wherein said fourth impurity region is formed by doping said second and third impurity regions with an impurity of the second conductivity type.

6. A device according to claim 1, wherein said fourth impurity region has a depth less than those of said second and third impurity regions, said depth being measured from the upper surface of said first diffusion layer.

* * * * *

UNITED STATES PATENT AND TRADEMARK OFFICE
CERTIFICATE OF CORRECTION

PATENT NO.  : 5,031,020
DATED       : July 09, 1991
INVENTOR(S) : Hiroshi Momose It is certified that error appears in the above-identified patent and that said Letters Patent is hereby corrected as shown below:

ON THE TITLE PAGE

Abstract, line 14, after "and" change "an" to --a--.

Abstract, line 16, change "and and" to --and--.

Abstract, line 19, change "Furthermore" to --Further--.

Abstract, line 24, before "drain" change "a" to --the--.

Claim 4, column 8, line 13, change "areas" to --area--.

Signed and Sealed this

Twentieth Day of July, 1993

Attest:

MICHAEL K. KIRK

Attesting Officer    Acting Commissioner of Patents and Trademarks